United States Patent
Mark et al.

(10) Patent No.: US 10,844,518 B2
(45) Date of Patent: Nov. 24, 2020

(54) CRUCIBLE

(71) Applicant: PLANSEE SE, Reutte (AT)

(72) Inventors: Michael Mark, Arzl I.P. (AT); Hannes Traxler, Lechaschau (AT); Michael O'Sullivan, Ehenbichl (AT); Wolfram Knabl, Reutte (AT); Alexander Lorich, Pflach (AT); Robert Schiftner, Ehrwald (AT)

(73) Assignee: Plansee SE, Reutte (AT)

( * ) Notice: Subject to any disclaimer, the term of this patent is extended or adjusted under 35 U.S.C. 154(b) by 152 days.

(21) Appl. No.: 16/073,184

(22) PCT Filed: Jan. 26, 2017

(86) PCT No.: PCT/AT2017/000004
§ 371 (c)(1),
(2) Date: Jul. 26, 2018

(87) PCT Pub. No.: WO2017/132711
PCT Pub. Date: Aug. 10, 2017

(65) Prior Publication Data
US 2019/0024260 A1    Jan. 24, 2019

(30) Foreign Application Priority Data

Feb. 5, 2016   (AT) ........................................ 22/2016

(51) Int. Cl.
*C30B 29/20*   (2006.01)
*C30B 35/00*   (2006.01)

(52) U.S. Cl.
CPC ............ *C30B 35/002* (2013.01); *C30B 29/20* (2013.01)

(58) Field of Classification Search
CPC .......... C30B 35/00; C30B 29/20; C30B 15/10
See application file for complete search history.

(56) References Cited

U.S. PATENT DOCUMENTS

| | | | |
|---|---|---|---|
| 9,938,635 B2 | 4/2018 | Gromann et al. | |
| 2013/0239882 A1* | 9/2013 | Bramhall, Jr. | C23C 16/18 117/223 |
| 2014/0202379 A1* | 7/2014 | Fonte | B21D 22/16 117/209 |

FOREIGN PATENT DOCUMENTS

| | | |
|---|---|---|
| CN | 202011185 U | 10/2011 |
| EP | 2902534 A1 | 8/2015 |
| EP | 2947054 A1 | 11/2015 |

(Continued)

OTHER PUBLICATIONS

E. Fromm, et al.; "Gase und Kohlenstoff in Metallen"; Reine und angewandte Metallkunde in Einzeldarstellungen; Year 1976; p. 535; vol. 26; Springer-Verlag.

(Continued)

*Primary Examiner* — Robert M Kunemund
(74) *Attorney, Agent, or Firm* — Laurence A. Greenberg; Werner H. Stemer; Ralph E. Locher

(57) ABSTRACT

A crucible includes a wall made of a base material of tungsten or molybdenum or of a material based on tungsten or molybdenum. A barrier layer is disposed at least in sections on an outer side of the wall and/or in the wall. The barrier layer is made of a metallic material having a greater affinity for carbon and/or oxygen than the base material. A method for using a crucible for producing single-crystal sapphire or fused quartz and a method for producing a crucible for high-temperature applications are also provided.

22 Claims, 6 Drawing Sheets

(56) References Cited

FOREIGN PATENT DOCUMENTS

| | | |
|---|---|---|
| JP | H0625855 A | 2/1994 |
| JP | 2010248615 A | 11/2010 |
| JP | 2012107782 A | 6/2012 |
| JP | 2013060348 A | 4/2013 |
| SU | 1213781 A1 | 4/1991 |
| WO | 2015002148 A1 | 1/2015 |

OTHER PUBLICATIONS

E. A. Brandes, et al.; Smithells Metals Reference Book; Year 1992; 7th Edition; Butterworth Heinemann; Great Britain.
"A Continuous Compilation of new Reference Data on Diffusion Processes in Inorganic Solids and their Melts"; Diffusion Data; May 1967; vol. 1, No. 1; Diffusion Information Center; Columbus, Ohio.

\* cited by examiner

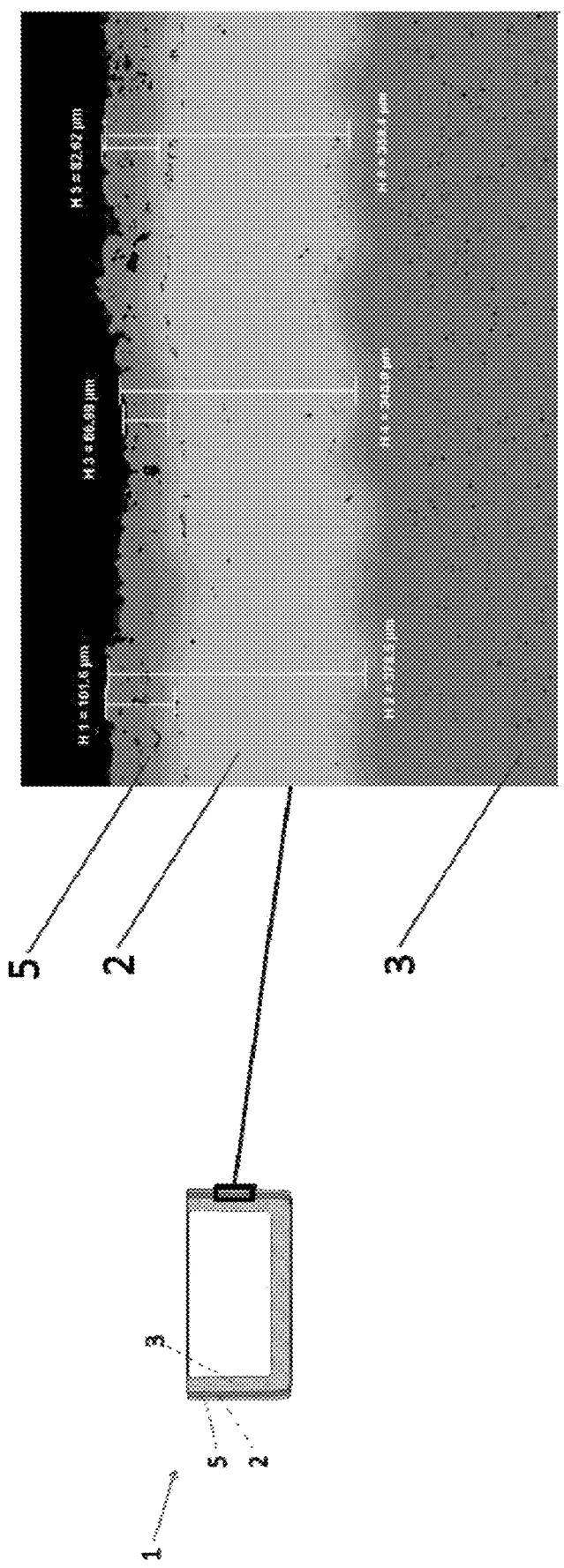

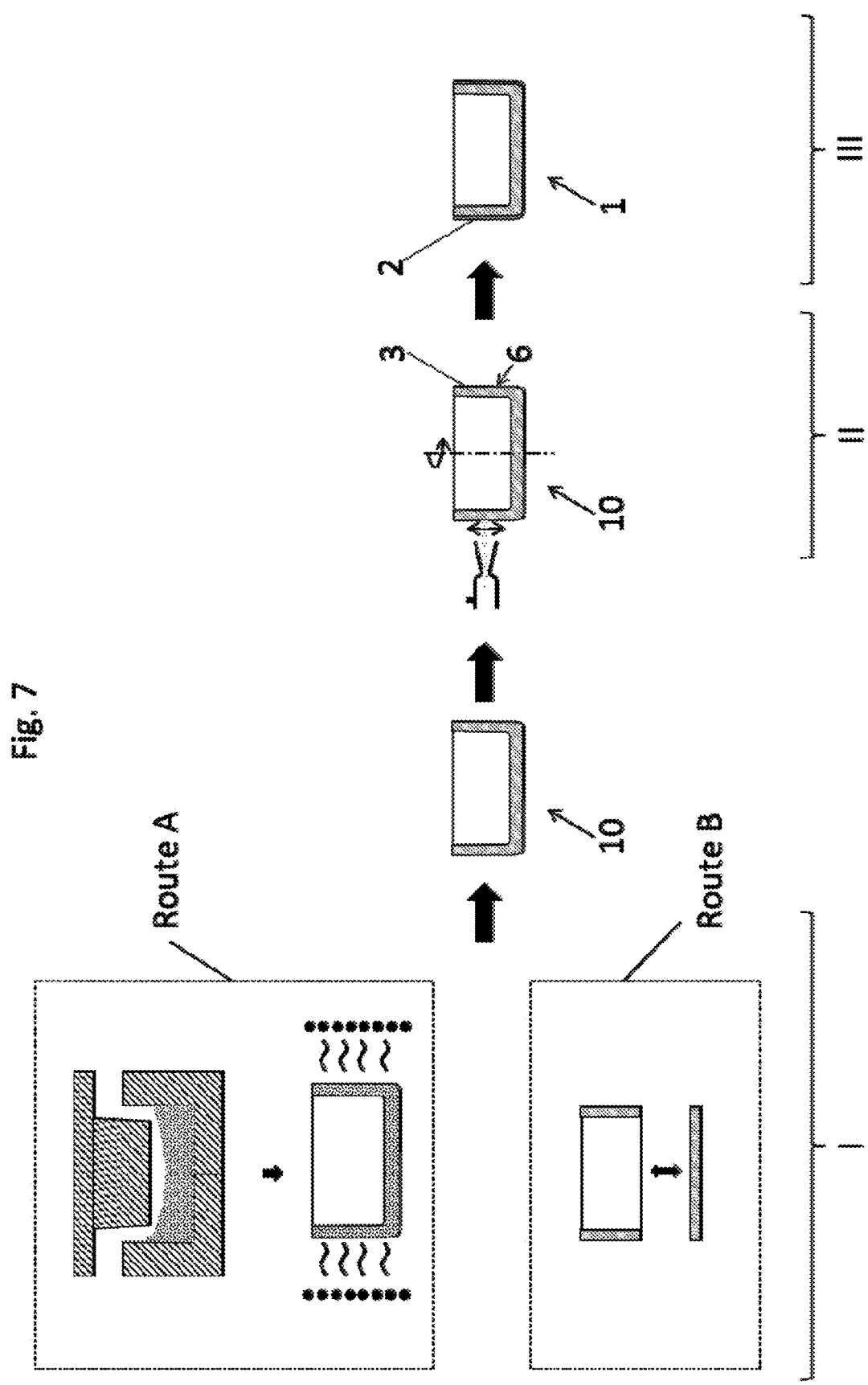

CRUCIBLE

BACKGROUND OF THE INVENTION

Field of the Invention

The invention relates to a crucible, particularly to a crucible for producing single-crystal sapphire, having a wall made of a base material of tungsten or molybdenum or of a material based on tungsten or molybdenum, and also to a method for producing such a crucible.

It is known practice from the prior art, for the melting of glass, especially fused quartz, and in the growing of sapphire monocrystals, to use crucibles made of refractory metals. It is general practice here to use crucibles comprising a base material of molybdenum or tungsten or alloys thereof. Refractory metals are understood in the context of this invention to comprise the metals of group 4 (titanium, zirconium, and hafnium), of group 5 (vanadium, niobium, tantalum), and of group 6 (chromium, molybdenum, tungsten) of the periodic table, and also rhenium. The properties of these materials include excellent dimensional stability at high service temperatures and chemical resistance toward numerous melts.

A problem which has emerged to affect the use of crucibles made of refractory metals in high-temperature applications (above 2000° C., for example) is the diffusion of oxygen into the base material of the crucible. The oxygen may come, for example, from a charging material with which the crucible has been fed. The oxygen which has diffused into the base material of the crucible may cause oxidative damage to the crucible base material.

Crucibles of the generic type are frequently deployed in carbon-containing atmospheres. The carbon may come, for instance, from heating equipment and/or charging equipment made of graphite. The carbon may migrate by diffusion into the base material of the crucible. Inwardly diffused carbon leads in general to formation of carbides with the base material and, consequently, to the embrittlement of that material.

The presence of oxygen and carbon in unison has proven particularly unfavorable. The oxygen which has diffused into the crucible can recombine with carbon to cause blistering and destruction of the crucible.

Japanese patent application JP2012107782 proposes furnishing the crucible base material with a getter material for oxygen, so that any inwardly diffused oxygen is bound by the getter material and there is therefore no unwanted blistering. Getter materials proposed in JP2012107782 are zirconium, hafnium or tantalum, which are present in the form of finely disperse particles in the crucible base material. To produce the crucible, JP2012107782 proposes a method in which the metal forming the crucible base material is mixed as a powder with the getter material and the resulting material is then pressed and sintered to form the crucible. A disadvantage of this method is that the introduction of getter material into the base material gives rise to restrictions with regard to forming and/or further processing. Nor is it possible to rule out contamination of the melt by the getter.

SUMMARY OF THE INVENTION

It is an object of the present invention to specify an improved crucible and also an improved method for producing a crucible.

These objects are achieved by a crucible having a wall made of a base material of tungsten or molybdenum or of a material based on tungsten or molybdenum, and a barrier layer which is disposed on an outer side of the wall and/or in the wall, at least in sections, and is made of a metallic material having a greater affinity for carbon and/or oxygen than the base material. These objects are also achieved by a method for producing a crucible for high-temperature applications, including the steps of providing a blank made of a base material of refractory metal by pressing and sintering refractory metal powder, preferably molybdenum or tungsten and alloys thereof or powder mixtures thereof, and/or by forming, and applying a barrier layer made of a metallic material having greater affinity for carbon and/or oxygen than the base material by thermal spraying, more particularly by cold gas spraying, or by a slurry process, to an outer side of the blank. Preferred embodiments are specified in the dependent claims.

The crucible comprises a wall made of tungsten or molybdenum or of a material based on tungsten or molybdenum. The material which forms the wall is referred to as the base material of the crucible.

A material based on tungsten is understood as a material having at least 50 at. % (atomic percent) of tungsten. Such materials are also referred to as tungsten-base alloys. A material based on molybdenum is understood as a material having at least 50 at. % (atomic percent) of molybdenum. Such materials are also referred to as molybdenum-base alloys. Possible examples of common molybdenum base alloys include ML (molybdenum-lanthanum oxide) or MoW (molybdenum-tungsten). A usual measure of impurities amounts for example to 30 µg/g carbon, 10 µg/g hydrogen, 10 µg/g nitrogen, 40 µg/g oxygen.

Through the configuration, on an outer side of the wall and/or in the wall, at least in sections, of a barrier layer made of a metallic material having greater affinity for carbon and/or oxygen than the base material, an inward diffusion of carbon into the base material of the crucible is prevented or reduced and the associated disadvantages are avoided.

Affinity refers to the degree of the driving force of a chemical reaction. This can be expressed, for instance, by the free enthalpy (Gibbs energy) or a reaction. If the Gibbs energy $\Delta G$ of a reaction is positive, the reaction proceeds only on supply of Gibbs energy. The lower, therefore, the Gibbs energy $\Delta G$ of a reaction, the greater the affinity of the reactants. A greater affinity for carbon and/or oxygen than the base material means, therefore, that the material envisaged for the barrier layer has a greater driving force for reaction with carbon and/or oxygen than does the base material of the crucible. The Gibbs energy of the reaction of tantalum with carbon to give a tantalum carbide, for example, is lower than the Gibbs energy of the reaction of tungsten or molybdenum with carbon to give a tungsten or molybdenum carbide, respectively.

The barrier layer is preferably formed of tantalum, niobium or titanium or of a material based on tantalum, niobium or titanium. With particular preference the barrier layer is formed of tantalum or of a material based on tantalum.

In trials by the applicant, it has emerged that a barrier layer of the invention effectively prevents inward diffusion of carbon into the base material of the crucible. In this way, the blistering described at the outset, caused by carbon, which has diffused into the base material, together with oxygen, which is able to cross over into the wall from a charging material or from an oven atmosphere, for example, is effectively prevented.

Likewise prevented by the barrier layer is the formation of phases of low melting point by carburization (carbonizing) of the base material. Particularly noteworthy here is the occurrence of a eutectic for molybdenum with 17 at. % carbon at 2200° C. The barrier layer prevents inward diffusion of carbon into the base material of the crucible and hence the formation of low-melting phases.

Additionally, the barrier layer avoids embrittlement to the base material of the crucible, triggered by formation of carbides. As a result of the high affinity for oxygen of the material which forms the barrier layer, the barrier layer binds oxygen, which as such can no longer contribute to the aforementioned blistering and, moreover, cannot attack the base material of the crucible by oxidation.

The barrier layer also constitutes a protection of the charging material (for example, aluminum oxide, $Al_2O_3$) and, consequently, of the end product against contaminants, which without a barrier layer are able to diffuse through the crucible wall.

The wall of the crucible comprises a shell and a base. The barrier layer may for example be configured only on or in the shell. It may also, however, be configured on or in the shell and on or in the base. It may also be configured only in or on the base.

"Interior" or "inner" in the context of the disclosure denotes an orientation in the direction of a cavity formed by the crucible. Conversely, "exterior" or "outer" denotes an orientation opposite to that. The cavity formed by the crucible is suitable for accepting a charging material.

With preference the barrier layer is configured on an outer side of the crucible wall. The outer side of the wall means that surface of the wall which with the crucible in service is remote from a charging material. In other words, the outer side of the wall in service is facing an oven chamber.

With the crucible in service there is frequently a carbon-containing atmosphere present, in view of the preferred use of graphitic oven components and heating conductors.

In contrast to the measures described in the prior art for protecting a crucible, namely application of protective layers which are intended to prevent a charging material reacting and or adhering to a surface of a charging facility, and/or introduction of getter material into the base material of the crucible, which is intended to bind inwardly diffused oxygen, the present invention takes an entirely different path: Since the barrier layer is configured of a metallic material having greater affinity for carbon than the base material, carbides are formed preferentially in the barrier layer with the carbon that is available with the crucible in service.

This may be discussed in more detail using the example of a barrier layer of tantalum. Tantalum and alloys of tantalum have a greater affinity for carbon than do molybdenum, tungsten or alloys thereof. This is apparent, for example, from a comparison of the reaction enthalpies of carbon with tantalum, with molybdenum and with tungsten, respectively; in this regard, see, for instance, E. Fromm and E. Gebhardt (eds.): Gase and Kohlenstoff in Metallen [Gases and carbon in metals], Springer Verlag, Berlin-Heidelberg-New York 1976.

During service of the crucible of the invention with a tantalum barrier layer in a carbon-containing oven atmosphere, therefore, tantalum carbide is formed in the barrier layer. Depending on the amount of carbon available and on the service period of the crucible, the entire barrier layer reacts to form tantalum carbide. The phases which form are $TaC_{0.5}$ (in an alternative notation, also referred to as $Ta_2C$) and, where carbon supply is sufficient, ultimately TaC.

The mechanism of action of the barrier layer through which diffusion of carbon into the base material of the shaped body is prevented is therefore initially the consumption of the inwardly diffusing carbon to form tantalum carbide in the barrier layer. If carbon continues to be available beyond the service period of the crucible, the rate of diffusion of the carbon through the carbide layer formed is significantly reduced and further diffusion of carbon into the base material of the crucible is effectively suppressed. The rate of diffusion of carbon into $TaC_{0.5}$ or TaC is lower by a multiple than the rate of diffusion of carbon into molybdenum, as the following table shows:

| Matrix | Element | D ($cm^2/s$) at 2100° C. |
|---|---|---|
| Mo | C | $(6-9) \times 10^{-6}$ |
| $TaC_{0.5}$ | C | $4 \times 10^{-8}$ |
| TaC | C | $7 \times 10^{-9}$ |

The first column "Matrix" indicates the matrix into which the element identified in the second column "Element" is diffusing. The third column "D ($cm^2/s$) at 2100° C." gives the diffusion coefficient in $cm^2/s$ of the element in the respective matrix at a temperature of 2100° C. The figures are taken from handbooks relating to diffusion in metals; see, for example, E. Fromm and E. Gebhardt (eds.): Gase and Kohlenstoff in Metallen [Gases and carbon in metals], Springer Verlag, Berlin-Heidelberg-New York 1976, Smithells Metals Reference Book, editors E. A. Brandes and G. B. Brook, 7th edition (1992), and Diffusion Data, vol. 1, No. 1 (1967).

From the comparison of the diffusion coefficients of carbon into molybdenum, $TaC_{0.5}$, and TaC, respectively, it is apparent that the diffusion rate of carbon into the tantalum carbides, $TaC_{0.5}$ and/or TaC, is lower by some orders of magnitude than into molybdenum.

This makes it clear that the barrier layer constitutes an effective diffusion barrier for carbon. Discussed with reference to the above example for tantalum, a barrier layer made of other metallic materials having a greater affinity for carbon than the base material is also effective analogously. For the selection of alternative suitable materials for the barrier layer, reference may be made to the aforesaid literature and/or relevant tabular works.

In the context of the present invention, a barrier layer is understood to be a continuous and substantially dense layer.

This barrier layer may be configured directly on an outer side of the wall of the crucible.

It is likewise conceivable for the barrier layer to be configured in a wall of the crucible.

It may be the case that the barrier layer is covered, preferably completely covered, by an outer layer made of a material different than the barrier layer, preferably of the base material which forms the crucible.

This variant can be realized, for example, by applying to the barrier layer a further layer, the outer layer, where the outer layer is formed preferably of the material that also forms the base material of the crucible. In the case of a crucible made of molybdenum, then, this means that an outer layer of molybdenum is applied to the barrier layer. In this variant, the barrier layer is protected by the additional layer, the outer layer, made of molybdenum. This has proven particularly advantageous for protecting the barrier layer from oxidation—for example, by decomposition products of an aluminum oxide melted in the crucible. An outer layer of this kind is also particularly advantageous when the crucible, comprising the barrier layer, is to be used in conditions under which the barrier layer is not resistant. An example of this is a hydrogen atmosphere for a barrier layer made of tantalum and/or of a tantalum alloy. The outer layer also serves to protect the charging material against possible contaminants from the barrier layer.

Provision may be made for producing the outer layer of a different material which protects the barrier layer from oxidation. Conceivable, for instance, is a ceramic layer, made of aluminum oxide layer, for example, that is applied by thermal spraying.

It may also be the case that a barrier layer is configured not only on the wall but also a barrier layer in the wall. This variant describes the case whereby a wall of the crucible is provided externally with a barrier layer and also a barrier layer is configured within the wall of the crucible. In this way a particularly high barrier effect to diffusion of carbon can be achieved. In other words, in this case, the wall of the crucible consists of a layer assembly.

The outer layer covers the barrier layer preferably completely. It is, however, also possible to conceive of the outer layer covering only partial regions of the barrier layer.

With preference the barrier layer is configured in an outer third of the wall. In other words this means that the barrier layer is disposed in that third of a wall thickness of the crucible that under crucible service conditions is facing an oven atmosphere. This is an expression of the idea that the barrier layer is preferably on the outside, based on a cross section of the wall of the crucible.

What this achieves is to ensure that any inwardly diffusing carbon is bound straightaway in an external—based on the cross section of the crucible—region, and diffusion into regions of the crucible that are situated further inward is prevented.

It is particularly advantageous if the barrier layer is configured as a substantially dense layer. This aspect is favorable with regard to a continuous barrier to diffusion of carbon into the base material of the crucible. If the barrier layer were to exhibit vacancies or significant porosity, there would be no effective barrier to diffusion of carbon.

The layer favorably has a relative density of more than 90%, preferably more than 95%, more preferably more than 99%. The relative density is the complement to the porosity; i.e., a relative density of 95% corresponds to a barrier layer porosity of 5%. The relative density may be determined, for instance, by quantitative structural analysis on a polished section of the barrier layer.

With preference the barrier layer has a thickness of between 25 µm and 500 µm, preferably between 100 µm and 300 µm, more preferably a thickness of between 175 µm and 225 µm. These layer thicknesses have been found in trials to be effective and cost-efficient.

It may be the case that the barrier layer is configured as a layer produced by a slurry process. The features of the slurry process are addressed later on below.

With preference the protective layer is configured as a thermal spray layer.

With particular preference the barrier layer is configured as a layer produced by cold gas spraying. The known process of cold gas spraying (or CGS) sees powder particles applied with very high kinetic and low thermal energy to a carrier material. The powder particles are accelerated by a process gas in a nozzle to velocities of typically 300 to 1200 m/s and are deposited on a substrate.

The skilled person is easily able to distinguish a layer produced via cold gas spraying from layers produced alternatively. In regions at least, the grains of the resultant layer have undergone cold deformation and are notable for high hardness by comparison with thermal spraying processes. A layer produced via cold gas spraying has a high relative density in the sense of a low porosity. In the case of cold gas spraying, moreover, the coating material is not melted and there is no process-related oxidation.

With preference the barrier layer contains at least 90 weight percent (wt %) of the metallic material having greater affinity for carbon and/or oxygen than the base material.

Particularly preferred is the use of the crucible as a crucible for producing single-crystal sapphire or fused quartz. In the case of the production of sapphire monocrystals, a crucible is usually fed with aluminum oxide ($Al_2O_3$) and the aluminum oxide in the crucible is heated in an oven up to its melting temperature of around 2050° C. The further process steps differ in the manner in which, from the molten aluminum oxide, the sapphire crystal is pulled and removed. Common processes are, for example, the Kyropoulos process, the HEM process (heat exchanger method) or the EFG process (edge-defined film-fed growth).

The method for producing the crucible of the invention comprises the steps of:
  providing a blank by pressing and sintering refractory metal powder, preferably molybdenum or tungsten or powder mixtures of these, and/or by forming,
  applying a barrier layer made of a metallic material having greater affinity for carbon and/or oxygen than the base material by thermal spraying, more particularly by cold gas spraying, or by a slurry process to an outer side of the blank Prior to the step of application of the barrier layer, blasting of those surfaces of the blank that are to be coated may optionally be provided. By blasting, sand blasting for example, the surface of the blank is prepared in such a way that the subsequently applied layer adheres more effectively.

In the context of the present specification, "blank" refers to the crucible before the application of the barrier layer. Like the crucible, therefore, the blank has at least one wall. The geometric relationships elucidated for the crucible are valid equally for the blank.

The blank is produced, for example, by pressing and sintering of a refractory metal powder, more particularly tungsten or molybdenum, or a powder mixture thereof. The refractory metal powder may be, for example, pure molybdenum powder or pure tungsten powder.

It is also possible, however, to use refractory metal alloys in powder form. It is likewise possible to use powder mixtures of refractory metals or alloys thereof.

The production pathway involving pressing and sintering of a power is commonly referred to as "p/s" for pressed-sintered.

Alternatively, the blank may be obtained by a forming operation. For this purpose, for example, a metal sheet is deep-drawn or press-formed. A further possibility is the production of the blank by bending of sheet metal.

A blank may also be obtained by first producing a surface shell in the form of a cylinder sleeve and joining it to a base section so as to obtain a cup. For this purpose, for example, the cylinder sleeve is inserted into a central opening in a cup base and joined by punching. As a result of the punching, sleeve and cup base are deformed, and so a rivet-like connection is produced.

It is likewise conceivable for a p/s blank to be subjected to a shaping step of forming.

Subsequently, the barrier layer made of the metallic material having greater affinity for carbon and/or oxygen than the base material is applied by thermal spraying, more particularly by cold gas spraying, or by a slurry process to the outer side of the wall of the blank.

Alternatives to the cold gas spraying include, for example, vacuum plasma spraying (VPS) or physical vapor deposition (PVD). On account of the lower yield of a VPS process relative to cold gas spraying, and of the slow layer construction in a PVD process, however, these alternatives are usually less cost-efficient than cold gas spraying. Yield refers to the proportion of the material used that actually contributes to the construction of the layer.

Also contemplated for applying the barrier layer is a slurry process. In this case a coating material in powder form—tantalum, for instance—is processed to a slurry with an organic binder and this slurry is applied to the surface to be coated. This process necessitates a heat treatment to drive out the binder and consolidate the powder layer.

Provision may be made for the application, to the barrier layer made of the metallic material having greater affinity for carbon and/or oxygen than the base material, of a further layer made of a further material, preferably of the material which forms the base material of the crucible.

The inventive method is elucidated in more detail by means of a production example:

For the crucible, a blank was produced from molybdenum by pressing and sintering of molybdenum powder. As already explained, shaping takes place on the powder in the case of the production route involving pressing and sintering.

The outer surface shell of the blank was coated with tantalum by cold gas spraying. The coating material used was commercially available tantalum powder (Amperit 151.065 from H. C. Starck GmbH, Laufenburg).

Coating parameters employed were as follows:
process gas: nitrogen
process gas pressure: 38 bar
Ta powder conveying rate: 46 g/min
process gas temperature: 800° C.
coating gun/base body distance: 40 mm Coating took place in overlapping tracks and was continued until a layer thickness of around 280 μm was reached.

The resulting barrier layer had a relative density of around 99.5%, or, expressed alternatively, a pore fraction of 0.05%. The pore fraction was determined by surface analysis from a scanning electron micrograph of the barrier layer as a polished section.

In trials, carbon was made available on the coated side of the crucible, and the crucible was heat-treated at 2100° C. for 6 hours. A metallographic investigation carried out subsequently showed no formation of carbides in the molybdenum base material. In the case of uncoated reference samples, conversely, there was significant formation of carbide found in the molybdenum base material. The tantalum barrier layer therefore effectively prevents the diffusion of carbon into the base material of the crucible, and the attendant negative effects.

In a further production example, an additional molybdenum layer 50 μm thick was applied to the tantalum barrier layer via an atmospheric plasma spray (APS) process. Application, alternatively, could also be accomplished by CGS.

Discussed in reference to the production example for tantalum, the invention is not confined to tantalum.

The barrier layer may also be implemented in other metallic materials having greater affinity for carbon and/or oxygen than the base material. Further candidates already identified have been niobium and titanium, and materials based on niobium or titanium. Regarding the selection of further suitable materials for the barrier layer, reference may be made to the stated literature and/or relevant tabular works.

With particular preference the barrier layer is formed of tantalum or of a material based on tantalum, since tantalum has particularly well-balanced properties in relation to the barrier effect and resistance.

BRIEF DESCRIPTION OF THE SEVERAL VIEWS OF THE DRAWING

The invention is elucidated in more detail below with reference to the figures. In the figures:

FIG. 6 shows a light micrograph of a barrier layer of the invention with additional outer layer as a polished section FIG. 7 shows a scheme of the method for producing a crucible of the invention

DESCRIPTION OF THE INVENTION

Figure 1:
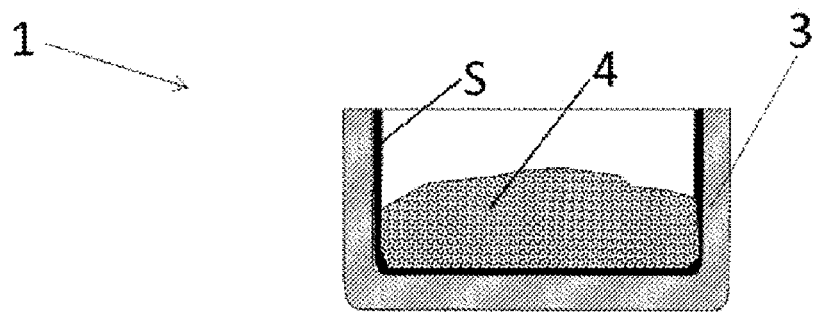
FIG. 1 shows a crucible with a protective layer (prior art)

FIG. 1 shows a prior-art crucible with a protective layer S on the inner side of the wall 3 of the crucible 1. The protective layer S prevents reaction and/or sticking of a charging material 4 to the crucible 1. A wall 3 of the crucible 1 consists, for example, of molybdenum. The protective layer S consists, for example, of tungsten.

Figure 2:
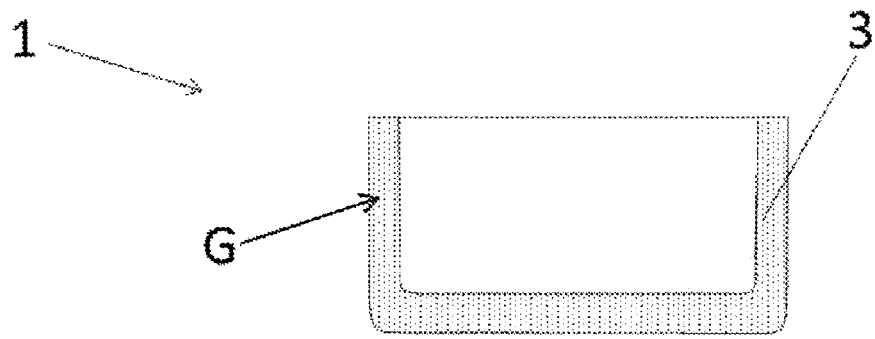
FIG. 2 shows a crucible having getter material embedded dispersely in the base material (prior art)

FIG. 2 shows a prior-art crucible 1 having a getter material G embedded dispersely in the base material of the crucible 1, depicted schematically in the form of dots. Suitable getter material G comprises elements with oxygen affinity such as zirconium, hafnium or tantalum. The getter material G is able to bind elements such as oxygen and/or carbon that diffuse into the base material of the crucible 1.

Figure 3A:
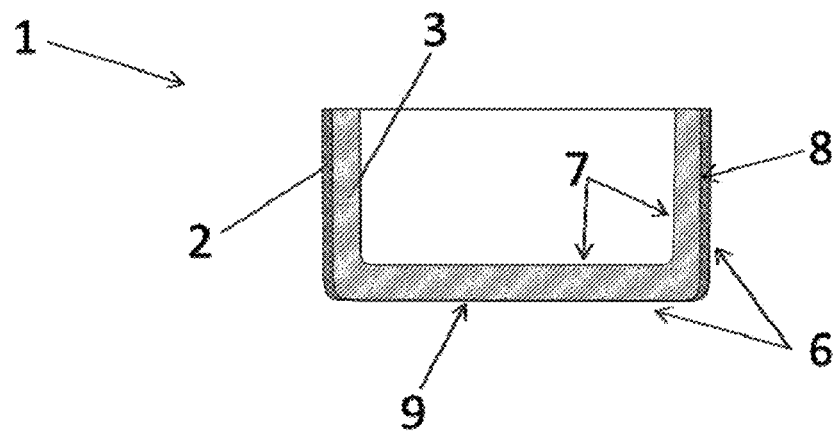
FIGS. 3a and 3b each show a crucible of the invention

FIG. 3a shows a crucible 1 according to the invention in a first exemplary embodiment.

In order to determine the orientations, the outer side 6 and the inner side 7 of the crucible 1 are shown using FIG. 3a. The crucible 1 has a surface shell 8 and a base 9. In the present exemplary embodiment, the surface shell 8 is a cylindrical surface and the base 9 is a circular surface. The crucible 1 may, however, also have a form which deviates from the cylindrical shape.

A barrier layer 2 is configured as a continuous and dense layer on the outer side of the wall 3. In the present exemplary embodiment, the barrier layer 2 is implemented as a tantalum layer applied by cold gas spraying. In the present exemplary embodiment according to FIG. 3a, the barrier layer 2 is implemented only on the surface shell 8 of the crucible 1.

Figure 3B:
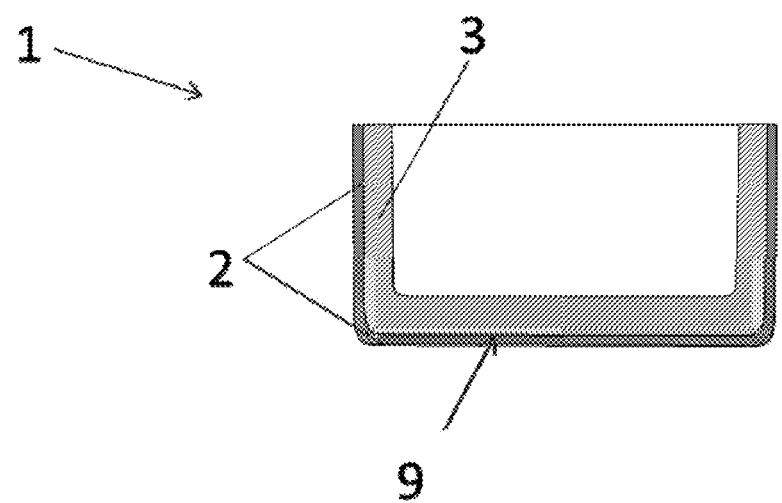

It is likewise possible for the barrier layer 2 to be implemented on the outer side of the base 9 as well, as shown in FIG. 3b.

Figure 4:
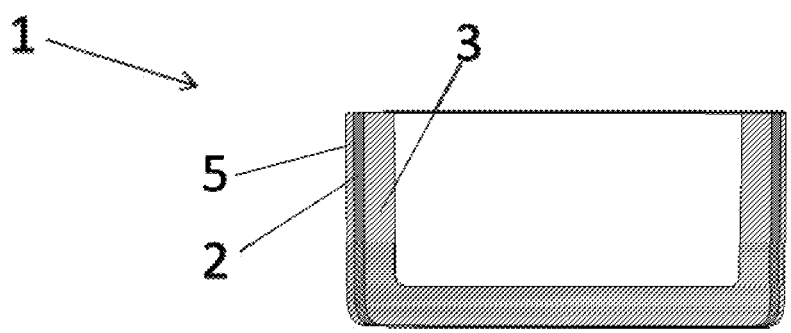
FIG. 4 shows a crucible of the invention in a further exemplary embodiment

FIG. 4 shows a crucible 1 of the invention in a further exemplary embodiment.

The barrier layer 2 is implemented as in the exemplary embodiment of FIG. 3a. In the present exemplary embodiment, however, the barrier layer 2 is also surrounded by a second layer, the outer layer 5, which consists preferably of the material which forms the base material of the crucible 1.

In the case of a crucible 1 made of molybdenum, therefore, the outer layer 5 is formed of molybdenum. The outer layer 5 is especially advantageous when the crucible 1, comprising the barrier layer 2, is to be used in conditions under which the barrier layer 2 is not resistant. An example of this is a hydrogen atmosphere for a barrier layer 2 made of tantalum or of a tantalum alloy.

Figure 5:
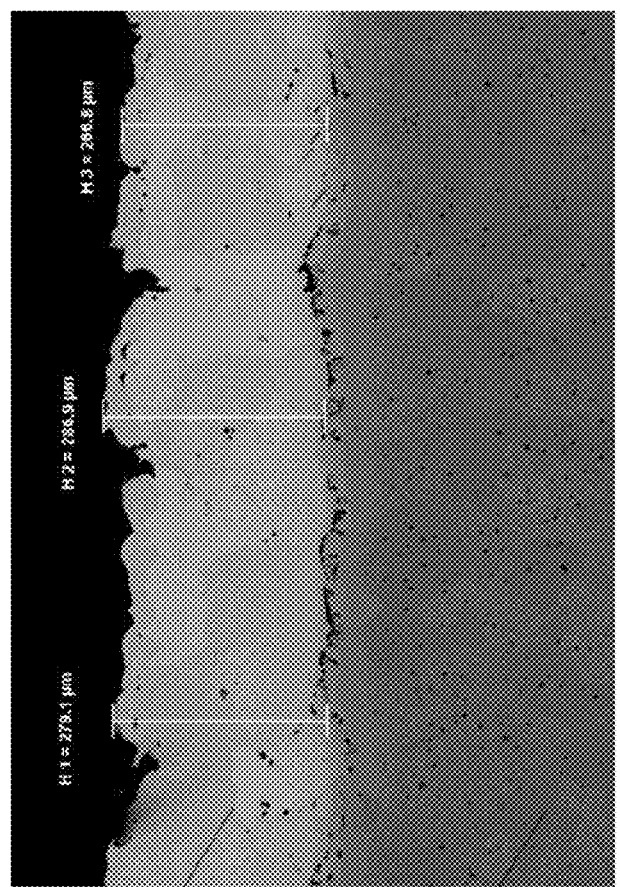
FIG. 5 shows a light micrograph of a barrier layer of the invention as a polished section
Figure 5:
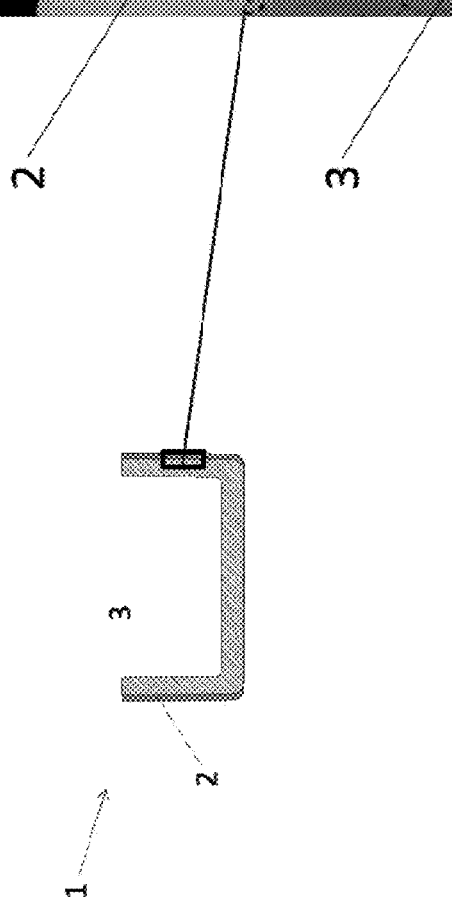

FIG. 5 shows a light micrograph of a barrier layer 2 in a polished section of a segment of the wall 3 of a crucible 1 of the invention in one exemplary embodiment. For orientation, the position of the micrograph in the wall 3 is illustrated.

The barrier layer 2 is applied by cold gas spraying to the wall 3 of the crucible 1. Between the barrier layer 2 and the wall 3, pores known as Kirkendall pores can be seen, which have formed as a result of heat treatment of the crucible 1. The thickness of the barrier layer 2 in the present example is approximately 280 μm.

FIG. 6 shows a light micrograph of a further exemplary embodiment of a barrier layer 2 in the polished section of a wall segment of a crucible 1 of the invention in a further exemplary embodiment. For orientation, the position of the micrograph in the wall 3 is illustrated. The barrier layer 2 is applied to the wall 3 of the crucible 1 by cold gas spraying. A further layer, the outer layer 5, is applied to the barrier layer 2. In the present example, the barrier layer 5 is a molybdenum layer applied by APS.

FIG. 7 shows, schematically, the method for producing a crucible 1 of the invention.

Step I:

Provision of a blank 10 by pressing and sintering refractory metal powder, preferably molybdenum or tungsten, or powder mixtures of these, and/or by forming.

In the left half of the picture, two alternative routes for the production of a blank 10 are shown. According to route A, the blank 10 is produced via pressing and sintering of starting powder made of Mo, W or powder mixtures thereof or alloyed powders.

According to route B, the blank 10 is produced via the joining of a surface shell 8 and a base 9, which have been produced beforehand by forming. Alternatively, the blank 10 could also be produced via deep-drawing or press-forming.

Step II:

Subsequently, a barrier layer 2 made of a metallic material having greater affinity for carbon and/or oxygen than the base material is applied to an outer side 6 of the wall 3 of the blank 10 by thermal spraying, more particularly by cold gas spraying. Examples of materials suitable for the barrier layer are tantalum, niobium or titanium, or materials based on tantalum, niobium or titanium—for example, alloys thereof.

Step III:

A crucible 1 of the invention with a barrier layer 2 is obtained.

LIST OF REFERENCE SYMBOLS USED

1 Crucible
2 Barrier layer
3 Wall
4 Charging material
5 Outer layer
6 Outer side of crucible
7 Inner side of crucible
8 Surface shell of crucible
9 Base of crucible
10 Blank
G Getter material
S Protective layer

The invention claimed is:

1. A crucible, comprising:
a wall made of a base material of tungsten or molybdenum or a material based on tungsten or molybdenum, said wall having an outer side;
a barrier layer disposed at least one of on said outer side of said wall or in said base material of said wall, at least in sections, said barrier layer being made of a metallic material having greater affinity for at least one of carbon or oxygen than said base material; and
an outer layer at least partly covering said barrier layer, said outer layer being made of a material different than said barrier layer.

2. The crucible according to claim 1, wherein said barrier layer is formed of tantalum, niobium or titanium or of a material based on tantalum, niobium or titanium.

3. The crucible according to claim 1, wherein said outer layer is made of said base material.

4. The crucible according to claim 1, wherein said barrier layer is disposed on an outer third of said wall.

5. The crucible according to claim 1, wherein said barrier layer is a substantially dense layer.

6. The crucible according to claim 1, wherein said barrier layer has a relative density of more than 90% and a porosity of less than 10%.

7. The crucible according to claim 1, wherein said barrier layer has a relative density of more than 95% and a porosity of less than 5%.

8. The crucible according to claim 1, wherein said barrier layer has a relative density of more than 99% and a porosity of less than 1%.

9. The crucible according to claim 1, wherein said barrier layer has a thickness of between 25 μm and 500 μm.

10. The crucible according to claim 1, wherein said barrier layer has a thickness of between 100 μm and 300 μm.

11. The crucible according to claim 1, wherein said barrier layer has a thickness of between 175 μm and 225 μm.

12. The crucible according to claim 1, wherein said barrier layer has characteristics of having been produced by a slurry process.

13. The crucible according to claim 1, wherein said barrier layer has characteristics of having been produced by thermal spraying.

14. The crucible according to claim 1, wherein said barrier layer has characteristics of having been produced by cold gas spraying.

15. The crucible according to claim 1, wherein said barrier layer contains at least 90% by weight of said metallic material having a greater affinity for at least one of carbon or oxygen than said base material.

16. A method for using a crucible, the method comprising the following steps:
providing a crucible including:
a wall made of a base material of tungsten or molybdenum or a material based on tungsten or molybdenum, the wall having an outer side;
a barrier layer disposed at least one of on the outer side of the wall or in the base material of the wall, at least in sections, the barrier layer being made of a metallic material having greater affinity for at least one of carbon or oxygen than the base material; and
an outer layer at least partly covering the barrier layer, the outer layer being made of a material different than the barrier layer; and
producing single-crystal sapphire or fused quartz in the crucible.

17. A method for producing a crucible for high-temperature applications, the method comprising the following steps:
    producing a blank made of a base material of refractory metal by at least one of pressing and sintering refractory metal powder or forming;
    applying a barrier layer to an outer side of the blank, the barrier layer being made of a metallic material having a greater affinity for at least one of carbon or oxygen than the base material; and
    carrying out the step of applying the barrier layer by thermal spraying or cold gas spraying or a slurry process.

18. The method according to claim 17, wherein the refractory metal powder is formed of molybdenum or tungsten, or alloys of molybdenum or tungsten or powder mixtures of molybdenum or tungsten.

19. The method according to claim 17, wherein the metallic material forming the barrier layer is tantalum, niobium or titanium or a material based on tantalum, niobium or titanium.

20. A method for producing a crucible for high-temperature applications, the method comprising the following steps:
    producing a blank made of a base material of refractory metal by at least one of pressing and sintering refractory metal powder or forming;
    applying a barrier layer to an outer side of the blank, the barrier layer being made of a metallic material having a greater affinity for at least one of carbon or oxygen than the base material; and
    applying an outer layer made of a further material to the barrier layer.

21. The method according to claim 20, wherein the outer layer is made of the base material.

22. A crucible, comprising:
    a wall made of a base material of tungsten or molybdenum or a material based on tungsten or molybdenum, said wall having an outer side;
    a barrier layer disposed at least one of on said outer side of said wall or in said base material of said wall, at least in sections, said barrier layer being made of a metallic material having greater affinity for at least one of carbon or oxygen than said base material; and
    said barrier layer being a cold-gas-sprayed layer formed of tantalum or a material based on tantalum.

* * * * *